United States Patent [19]

Godinho et al.

[11] Patent Number: 5,365,104
[45] Date of Patent: Nov. 15, 1994

[54] OXYNITRIDE FUSE PROTECTIVE/PASSIVATION FILM FOR INTEGRATED CIRCUIT HAVING RESISTORS

[75] Inventors: Norman Godinho, Los Altos Hills; Hai-Pyng Liaw, Cupertino, both of Calif.

[73] Assignee: Paradigm Technology, Inc., San Jose, Calif.

[21] Appl. No.: 36,754

[22] Filed: Mar. 25, 1993

[51] Int. Cl.$^5$ .............................................. H01L 27/02
[52] U.S. Cl. .................................... 257/529; 257/536; 257/639
[58] Field of Search ............... 257/649, 639, 529, 530, 257/536, 538

[56] References Cited

U.S. PATENT DOCUMENTS

| | | | |
|---|---|---|---|
| 4,543,707 | 10/1985 | Ito et al. | 257/639 |
| 4,855,804 | 8/1989 | Bergami et al. | 257/639 |
| 4,907,064 | 3/1990 | Yamazaki et al. | 257/649 |
| 5,166,771 | 11/1992 | Godinho et al. | 257/368 |
| 5,172,211 | 12/1992 | Godinho et al. | 257/536 |

FOREIGN PATENT DOCUMENTS 64-10644  1/1985  Japan .................................. 257/639

*Primary Examiner*—Rolf Hille
*Assistant Examiner*—S. V. Clark
*Attorney, Agent, or Firm*—Skjerven, Morrill, MacPherson, Franklin & Friel

[57] ABSTRACT

An oxynitride passivation layer and/or fuse protective layer for an SRAM cell having load resistors, where the composition of the oxynitride layer minimizes the effect of hydrogen diffusion on the resistance of underlying load resistors. The index of refraction of the oxynitride is between 1.60 and 1.85. This oxynitride does not substantially diffuse hydrogen into the load resistors even when heated to temperatures over 400° C., and hence, avoids altering resistance during subsequent annealing steps.

12 Claims, 4 Drawing Sheets

OXYNITRIDE FUSE PROTECTIVE/PASSIVATION FILM FOR INTEGRATED CIRCUIT HAVING RESISTORS

BACKGROUND OF THE INVENTION

1. Field of the Invention

This invention relates to the composition of passivation and fuse protective layers used in integrated circuits (ICs), and in particular, to a specified oxynitride composition for a fuse protective or passivation layer that avoids hydrogen diffusion into polysilicon structures such as resistors.

2. Description of Related Art

Many integrated circuits (ICs), such as Static Random Access Memory (SRAM), employ resistors that must have a specified resistance value after fabrication. An example is U.S. Pat. No. 5,172,211 to Godinho et al. entitled "High Resistance Polysilicon Load Resistor" incorporated here in its entirety by reference. Another example is U.S. Pat. No. 5,166,771 to Godinho et al. entitled "Self-Aligned Contact and Interconnect Structure" also incorporated here in its entirety by reference.

In the manufacture of ICs having resistors, some of the processing steps performed after resistor formation may undesirably alter the resistances. Some of these steps take place after formation of a fuse protective layer or a passivation layer.

Fuse protective layers protect underlying IC elements while the IC is being tested and repaired. One example of a fuse protective layer is used in an SRAM IC. It is well known in the art to provide in an SRAM redundant memory cells or redundant columns of memory cells, and to use the redundant cells to repair the SRAM if some of the cells in the SRAM are defective. To permit replacement of cells, IC repair fuses or antifuses are included in the SRAM for disconnecting defective cells and replacing the defective cells with redundant cells. During manufacturing, the SRAM is tested, and if defective cells are found, appropriate repair fuses are blown and defective cells are replaced.

Typically, to prevent damaging the SRAM during test and repair, the SRAM is covered with a fuse protective layer. The fuse protective layer defines openings to make electrical connections therethrough, and windows that permit passage of a laser beam to blow underlying fuses. The fuse protective layer otherwise protects the remainder of the SRAM from being scratched or contaminated during test and repair. Materials used as fuse protective layers include silicon dioxide, doped silicate glass, silicon nitride, and oxynitride, and combinations of the above.

After the test and repair, a passivation layer is formed over the fuse protective layer to cover up the fuse openings and to further protect the IC from scratches, moisture, and chemical contaminants. Typically, a silicon nitride passivation layer is deposited using chemical vapor deposition.

ICs also undergo thermal processes, such as alloying to anneal charges, after the formation of a fuse protective layer or after the formation of a passivation layer. During formation of fuse protective and passivation layers and during subsequent alloying of the IC, the resistances of IC resistors may change. In an SRAM the change in resistance of a load resistor undesirably changes the voltage retention capabilities of a cell, and may make some cells inoperable. The production yield of SRAM ICs is thereby decreased, increasing unit costs.

Consequently, materials and methods are needed for forming fuse protective and passivation layers that do not alter the resistance of underlying resistors during formation of the layer or when the IC is subjected to thermal processes.

SUMMARY OF THE INVENTION

Disclosed here is a solution to the problem of prior art passivation layers and fuse protective layers which undesirably change the resistances of circuit elements during IC fabrication. Prior art silicon nitride passivation layers formed using chemical vapor deposition have been found to contain a high level of hydrogen which is believed to diffuse into underlying components of an IC and unpredictably change the resistance of the components, often causing defects in ICs and reducing yield. A similar problem occurs with prior art silicon nitride fuse protective layers, even when used in combination with an underlying doped silicate glass layer. Embodiments of the invention provide methods and structures for fuse protective layers and passivation layers that reduce or eliminate changes in resistance caused by hydrogen diffusion.

One embodiment of the invention employs an oxynitride passivation layer and/or fuse protective layer, where the composition of the oxynitride layer has been determined to minimize the effect of hydrogen diffusion and yet still provide a sufficiently strong and chemically resistant layer. In particular embodiments, the passivation or fuse protective layer is oxynitride having a index of refraction between about 1.60 and 1.85, with an index of refraction of 1.70 thought to be optimal. Such an oxynitride layer does not release much hydrogen even when subjected to processes at higher than the deposition temperature (400° C.). One embodiment employs a first oxynitride layer as a fuse protective layer and a second oxynitride passivation layer.

DETAILED DESCRIPTION OF THE PREFERRED EMBODIMENTS

Figure 1:
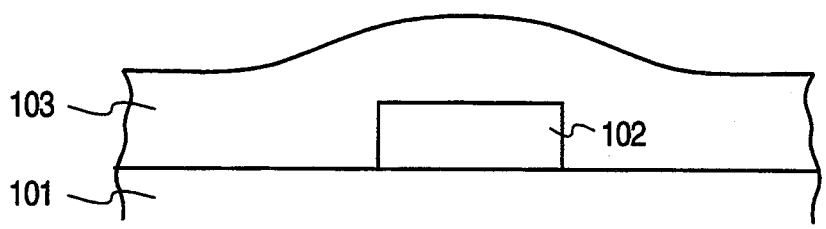
FIGS. 1, 2, 3, 4, 5, 6, 7A, 7B, and 8 show cross-sectional views of a portion of an IC formed in accordance with the invention.

FIG. 1 shows a cross-section of a load resistor 102 formed overlying a semiconductor substrate 101. This is a portion of an SRAM cell. A doped silicate glass layer 103 overlies the substrate 101 and the load resistor 102. The resistor 102 is an undoped region of polycrystalline silicon, but any type resistor or circuit element which might be effected by diffused hydrogen would benefit from the disclosed structure.

The substrate 101 contains conventional active elements (i.e. transistors that are not illustrated) that form components of an IC such as an SRAM. Examples of active element and methods for forming the active elements are described in the above-referenced patents. The doped silicate glass layer 103 is boro-phosphosilicate glass (BPSG) and is a getter of contaminants that might affect the resistor 102. However, BPSG is not effective at stopping hydrogen diffusion.

Figure 2:
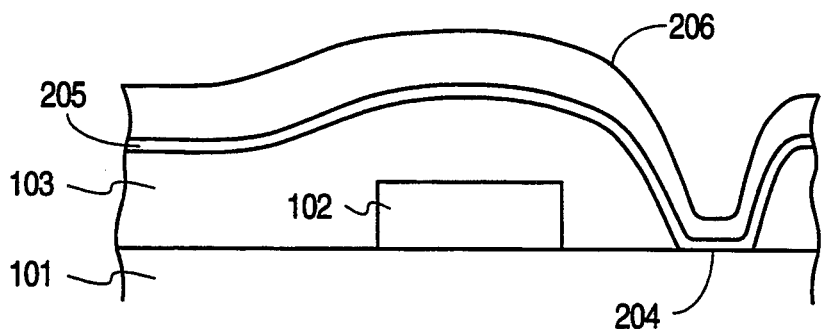

After formation of load resistor 102 and glass layer 103, other overlying circuit elements may be formed. For example, the glass layer 103 is masked and etched to provide openings, then metal traces and interconnects are formed thereover. FIG. 2 shows a thin conducting barrier layer 205 and a metal layer 206 overlying the resistor 102 and the substrate 101. The metal layer 206 may be formed of aluminum and the barrier layer 205 formed of titanium which is thermally processed to form titanium nitride, TiN. Titanium nitride is a good conductor and also a good barrier to prevent spiking of aluminum into the silicon substrate. The conducting layers 205 and 206 make contact to the substrate 101 through contacts such as 204.

Figure 3:
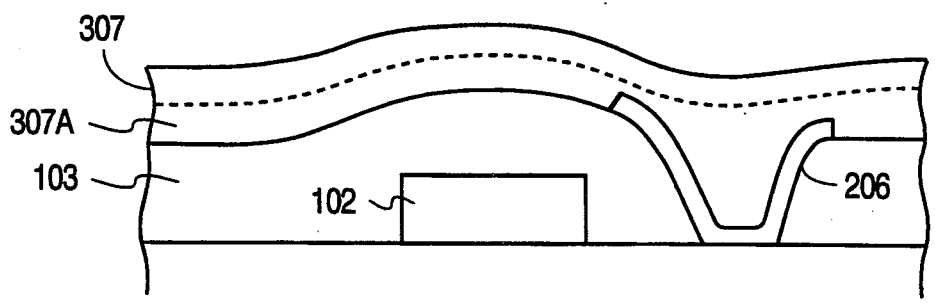

As shown in FIG. 3, the metal layer 206 is conventionally masked and etched to form a pattern of interconnects. A first oxide insulating layer 307 is deposited using standard techniques to a thickness of 1.25 μm overlying the metal interconnects 206. The first oxide layer 307 is planarized using photoresist, then etched back to the contour 307A.

Figure 4:
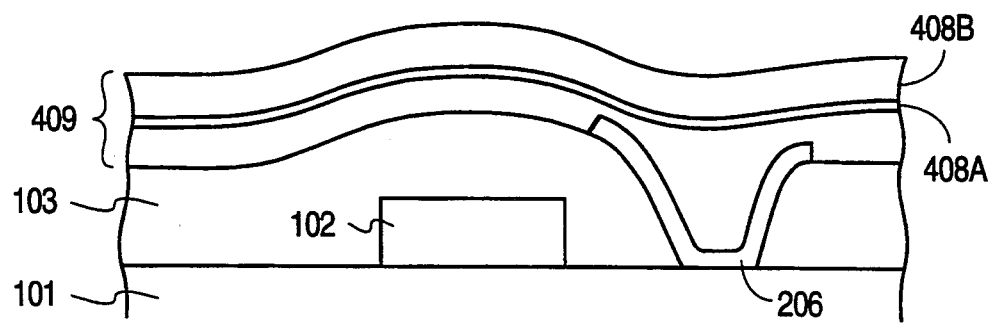
Figure 5:
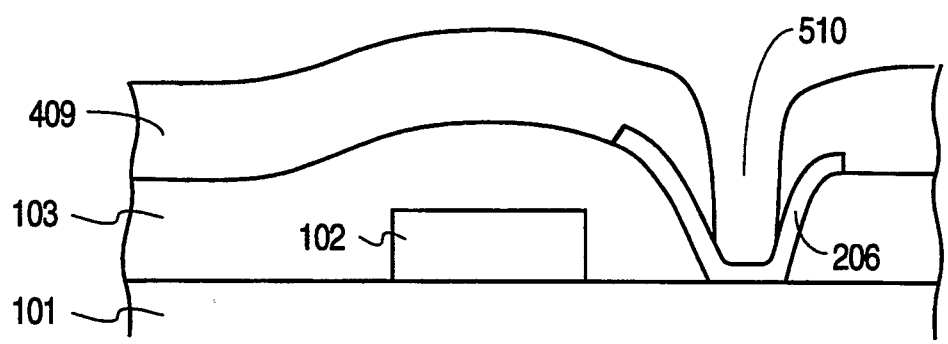

As shown in FIG. 4, a doped silicate glass layer 408A and a second oxide layer 408B are formed sequentially on the oxide layer 307A. The doped silicate glass layer 408A is phosphorous silicate glass (PSG) and serves as a getter of contaminants. The three insulating layers 307A, 408A, and 408B together form a intermetal oxide layer 409. The term intermetal refers to placement of the layer 409 between the metal layer 206 and a metal layer 611 described below. The intermetal oxide layer 409 is etched to provide contact openings 510 where needed, as shown in FIG. 5.

Figure 6:
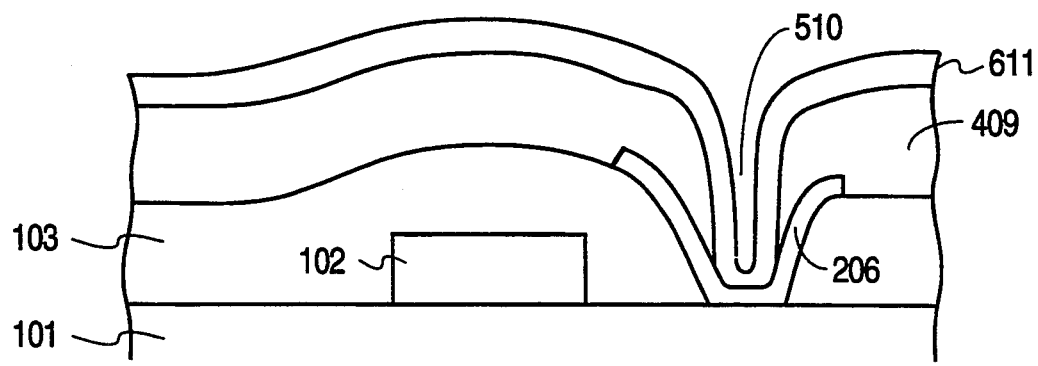

The second metal layer 611 is then formed of aluminum deposited over the intermetal oxide layer 409 and in the openings 510, as shown in FIG. 6. The metal layer 611 is conventionally masked and etched to form a second layer of interconnects. With etching of the metal layer 611, the IC is complete except for a fuse protective layer, a passivation layers, and packaging.

Figure 7A:
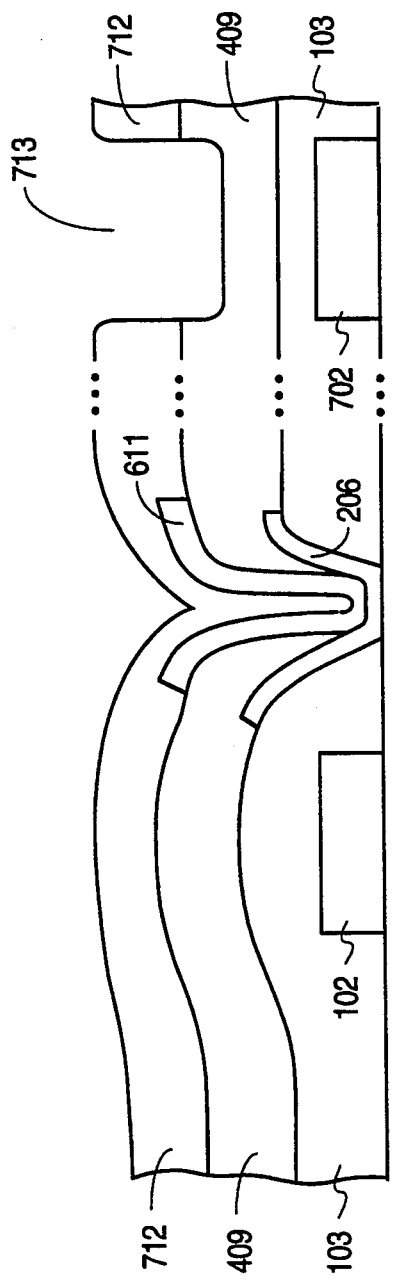

In the case of an SRAM with redundant memory cells or the case of other repairable ICs, repair fuses, such as fuse 702, or anti-fuses (not shown) may be provided as shown in FIG. 7A on another portion of the substrate 101. Fuse 702 is formed from polycrystalline silicon which is subsequently doped. FIG. 7A shows the fuse 702 and the resistor 102 in the same layer of the IC and laterally separated from each other. However, fuses (or anti-fuses) may have other construction and may be formed in various layers of the IC.

A fuse protective layer 712 is formed overlying the second layer of metal interconnects 611, the intermetal oxide layer 409, and the fuse 702. The fuse protective layer 712 and intermetal oxide layer 409 are masked and etched using an RIE (dry etch) or other suitable technique to provide pad openings (not shown) and windows such as window 713 through the fuse protective layer 712. (One such window is associated with each fuse on the IC.) The pad openings are for making electrical connections during testing of the IC, while the windows are provided to permit a laser beam to blow the fuse 702 if necessary to repair the IC. As shown, the window 713 is not etched all the way through to the fuse 702. The remaining portion of oxide layers 409 and 103 has a thickness that enables a laser beam to blow the fuse 702. The desired oxide thickness may be optimized for the energy of the laser beam used. The fuse protective layer 712 otherwise protects metal interconnects 611 from being damaged during the test and repair process.

In the embodiment of FIG. 7A, the fuse protective layer is a doped silicate glass layer such as a phosphorous silicate glass (PSG) layer which is 3% phosphorous by weight and approximately 4000 Å thick. PSG has an advantage over silicon nitride fuse protective layers used in some prior art processes. Typically, silicon nitride is formed using chemical vapor deposition where a mixture of silane ($SiH_4$), ammonia ($NH_3$), and nitrogen ($N_2$) heated to about 400° C. flows past a substrate. Silicon nitride formed in this manner has been found to have a significant concentration of hydrogen mixed in the film structure, and the hydrogen has a tendency to diffuse away from the silicon nitride when heated. In any step that heats the silicon nitride layer, especially if the heating exceeds the formation temperature of the silicon nitride, hydrogen diffuses from the silicon nitride and may change the resistance of underlying resistors. PSG does not have a significant hydrogen concentration or a problem with hydrogen diffusion; however PSG is not as scratch resistant as silicon nitride.

Figure 7B:
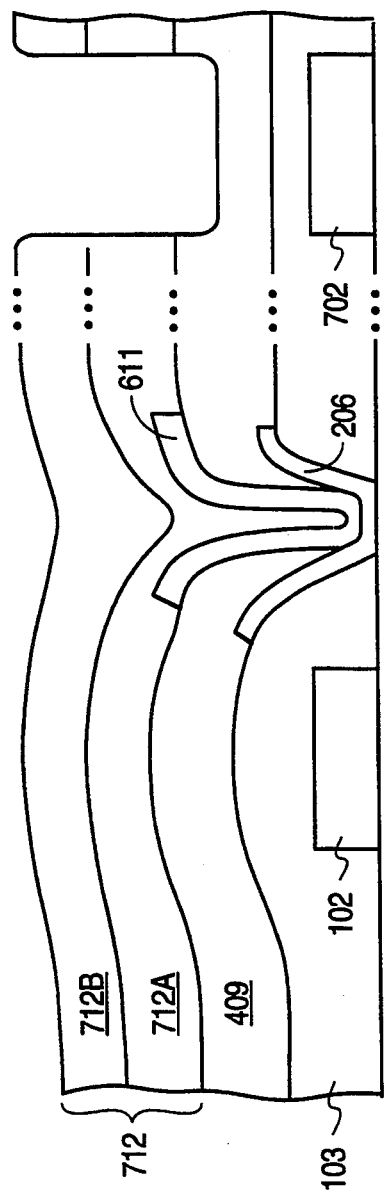

In a second embodiment shown in FIG. 7B, the fuse protective layer 712 is formed from a layer of doped silicate glass 712A and an overlying layer of oxynitride 712B. The doped silicate glass layer 712A is PSG 3% phosphorous by weight and 4000 Å thick. In contrast to other oxynitride fuse protective layers, the oxynitride layer 712B has a composition chosen to minimize diffusion of hydrogen therefrom. The thickness of the oxynitride layer 712B is between 6000 Å and 10,000 Å, being 10,000 Å in one version.

Oxynitride is a class of materials that are mixtures of mainly silicon dioxide ($SiO_2$) and silicon nitride ($Si_3N_4$). The relative proportion of silicon dioxide to silicon nitride may be varied over a range of values. Different compositions of oxynitride have different properties, such as different hydrogen content and index of refraction. In one embodiment of the present invention, the oxynitride has an index of refraction in the range of 1.60 to 1.85. Oxynitride with index of refraction of 1.70 has been found to be optimum and not to alter the resistance of nearby polysilicon resistors, even if the oxynitride is heated to over 400° C. By comparison, oxynitride as used in other processes and having a refractive index above about 1.85 is found to alter resistances to substantially the same extent as does silicon nitride.

The above described oxynitride layer may be formed using equipment commercially available from Novellus, using plasma enhanced chemical vapor deposition (PECVD) having a gas flow of 0.2 liters per minute (lpm) of $SiH_4$, 2 lpm of $NH_3$, 1.6 lpm of $N_2O$, and 5 lpm of $N_2$ at 2.0 Torr, a temperature of 400 ° C., and power setting of 0.25 KW high frequency (HF) and 0.65 KW low frequency (LF). The resulting oxynitride has a refractive index of 1.70+/−0.05 as measured by an ellipsometer, and with a compressive stress of $2.0 \times 10^9$ dynes/cm$^2$.

Table I shows recipes for formation of oxynitride layers having refractive indexes in accordance with the invention between 1.60 and 1.85:

TABLE I

|  | REF. IND. | | | | | |
|---|---|---|---|---|---|---|
|  | 1.60 | 1.65 | 1.70 | 1.75 | 1.80 | 1.85 |
| $SiH_4$ (1 pm) | 0.2 | 0.2 | 0.2 | 0.2 | 0.2 | 0.2 |
| $NH_3$ (1 pm) | 0.7 | 0.75 | 2 | 2 | 2 | 2 |
| $N_2O$ (1 pm) | 2.7 | 1.8 | 1.6 | 1 | 0.5 | 0.3 |
| $N_2$ (1 pm) | 4 | 4.5 | 5 | 5 | 5 | 5 |
| TOTAL (1 ppm) | 7.60 | 7.25 | 8.80 | 8.20 | 7.70 | 7.50 |
| HF-PR (KW) | 0.15 | 0.15 | 0.25 | 0.25 | 0.25 | 0.20 |
| LF-PR (KW) | 0.75 | 0.75 | 0.65 | 0.65 | 0.65 | 0.70 |

TABLE I-continued

| | REF. IND. | | | | | |
|---|---|---|---|---|---|---|
| | 1.60 | 1.65 | 1.70 | 1.75 | 1.80 | 1.85 |
| PRES. (Torr) | 2 | 2 | 2 | 2 | 2 | 2 |
| TEMP °C. | 400 | 400 | 400 | 400 | 400 | 400 |

After the fuse protective layer 712 is conventionally masked and etched to provide openings and windows such as 713 as described above, a first "alloy" step is performed which heats the IC to anneal the metal layers. The IC advantageously can be heated to over 400° C. without causing undesirable hydrogen diffusion. After the first alloy step the IC is tested and repaired if necessary and possible.

Figure 8:
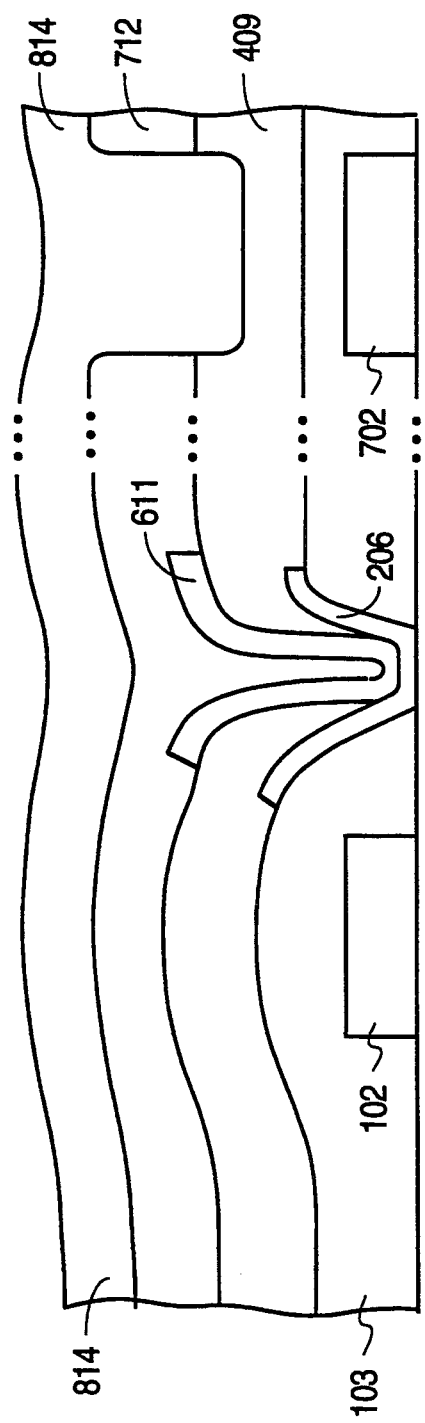

Referring now to FIG. 8, after test and repair, a passivation layer 814 is formed on the fuse protective layer 712. The passivation layer 814 is oxynitride having an index of refraction of 1.70 (between 1.60 and 1.85), formed using the same technique as described above. In the embodiment of FIG. 7A, where the fuse protective layer 712 consists of 4000 Å thick PSG, the oxynitride passivation layer 814 is 17,000 Å thick. In the embodiment of FIG. 7B, where the fuse protective layer 712 consists of a 4000 Å thick PSG layer 712A and a 10,000 Å thick oxynitride layer 712B, the oxynitride passivation layer 814 is 7,000 Å thick. The total thickness of oxynitride, in the fuse protective layer plus the passivation layer, is 17,000 Å in both embodiments, and the total thickness of the fuse protective layer plus the passivation layer is 21,000 Å in these embodiments.

After formation, the oxynitride passivation layer 814 is masked using photoresist and etched using an RIE etch step to provide openings to metal bonding pads formed in the layer 611. The IC then undergoes a second alloy (heating) step to anneal the metal layers. Again, use of the oxynitride passivation layer 814 with the novel composition described permits the IC to be heated to over 400° C. without causing undesirable hydrogen diffusion. Finally, the IC is conventionally sorted and inked.

Although the present invention has been described in detail, the description is an illustration and should not be taken as a limitation. Many other embodiments of the invention are possible. For example, as will be appreciated by those skilled in the art, the layers between the resistor 102 and the passivation layer 814 are largely unrelated to the use of oxynitride in the passivation layer and may be formed or constituted in a number of ways. In particular, the oxynitride passivation layer 814 described may be used in an IC with or without repair fuses and/or a fuse protective layer. Accordingly, the scope of the present invention is limited only by the claims.

We claim:

1. An integrated circuit comprising:
   a semiconductor substrate;
   a resistive element formed overlying the substrate;
   a fuse formed overlying the substrate and laterally spaced apart from the resistive element;
   a fuse protective layer overlying the fuse, wherein the fuse protective layer comprises a layer of doped silicate glass and a first oxynitride layer overlying the doped silicate glass layer the first oxynitride layer having a composition with a refractive index in a range of about 160 to 1.85; and
   a second oxynitride layer formed overlying the resistive element as an uppermost layer of the integrated circuit.

2. The integrated circuit of claim 1, wherein the second oxynitride layer has a composition with a refractive index in a range of about 1.60 to 1.85.

3. The integrated circuit of claim 2, wherein the second oxynitride layer has a composition with a refractive index of about 1.70.

4. The integrated circuit of claim 1, wherein the composition of the second oxynitride layer is such that when the integrated circuit is heated to over 400° C., the resistance of the resistive element is not changed by release of hydrogen from the oxynitride layer into the resistive element.

5. The integrated circuit of claim 1, wherein the resistive element comprises polycrystalline silicon.

6. An integrated circuit including a plurality of layers and comprising:
   a semiconductor substrate;
   a resistive element formed overlying the substrate, wherein the resistive element comprises polycrystalline silicon;
   an oxynitride layer formed overlying the resistive element as an uppermost layer of the integrated circuit, the oxynitride layer having a composition which does not release enough hydrogen to alter substantially the resistance of the resistive element;
   a fuse formed overlying the substrate and laterally spaced apart from the resistive element; and
   a fuse protective layer between the fuse and the oxynitride layer, wherein the fuse protective layer comprises a layer of doped silicate glass and a second oxynitride layer formed overlying the doped silicate glass layer and wherein the composition of the second oxynitride layer has a refractive index in a range of about 1.60 to 1.85.

7. The integrated circuit of claim 6, wherein the composition of the second oxynitride layer has a refractive index of about 1.70.

8. An integrated circuit including a plurality of layers and comprising:
   a semiconductor substrate;
   a resistive element formed overlying the substrate, wherein the resistive element comprises polycrystalline silicon
   an oxynitride layer formed overlying the resistive element as an uppermost layer of the integrated circuit, the oxynitride layer having a composition which does not release enough hydrogen to alter substantially the resistance of the resistive element;
   a fuse formed overlying the substrate and laterally spaced apart from the resistive element; and
   a fuse protective layer between the fuse and the oxynitride layer, wherein the fuse protective layer comprises a layer of doped silicate glass and a second oxynitride layer formed overlying the doped silicate glass layer, and the composition of the second oxynitride layer is such that when the integrated circuit is heated to over 400° C., the resistance of the resistive element is not altered by diffusion of hydrogen from the second oxynitride layer into the resistive element.

9. The integrated circuit of claim 2, further comprising a plurality of electrical elements formed on the substrate.

10. The integrated circuit of claim 9, wherein the resistive element comprises polycrystalline silicon.

11. The integrated circuit of claim 10, wherein the first oxynitride layer has a composition with a refractive index of about 1.70.

12. The integrated circuit of claim 11, wherein the second oxynitride layer has a composition with a refractive index of about 1.70.

* * * * *